(12) United States Patent
Spencer et al.

(10) Patent No.: US 11,714,736 B2
(45) Date of Patent: Aug. 1, 2023

(54) RELATIVE HUMIDITY SENSOR

(71) Applicant: Micron Technology, Inc., Boise, ID (US)

(72) Inventors: Brooke Spencer, Boise, ID (US); Jennifer F. Huckaby, Boise, ID (US); Yi Hu, Boise, ID (US); Deepti Verma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 408 days.

(21) Appl. No.: 16/943,890

(22) Filed: Jul. 30, 2020

(65) Prior Publication Data
US 2022/0035720 A1 Feb. 3, 2022

(51) Int. Cl.
*G06F 11/30* (2006.01)
*H05K 7/20* (2006.01)
*G06F 11/32* (2006.01)

(52) U.S. Cl.
CPC ...... *G06F 11/3058* (2013.01); *G06F 11/3024* (2013.01); *G06F 11/3037* (2013.01); *G06F 11/32* (2013.01); *H05K 7/20136* (2013.01); *H05K 7/20209* (2013.01)

(58) Field of Classification Search
CPC ............. G06F 11/3058; G06F 11/3037; G06F 11/3024; G06F 11/32; H05K 7/20209; H05K 7/20136
See application file for complete search history.

(56) References Cited

U.S. PATENT DOCUMENTS

| | | | |
|---|---|---|---|
| 9,890,969 B2* | 2/2018 | Martin | G01N 33/0075 |
| 10,560,529 B2 | 2/2020 | Jiang et al. | |
| 10,670,448 B2 | 6/2020 | Aina et al. | |
| 10,682,263 B2 | 6/2020 | Heil et al. | |
| 10,690,413 B2 | 6/2020 | Zielinkski et al. | |
| 10,734,035 B1* | 8/2020 | Sun | G11B 33/1453 |
| 2014/0149795 A1* | 5/2014 | Musha | G06F 11/0712 |
| | | | 714/30 |
| 2017/0285082 A1* | 10/2017 | Guo | G01D 5/165 |
| 2017/0288451 A1 | 10/2017 | Trusty et al. | |
| 2017/0332062 A1 | 11/2017 | Chang et al. | |
| 2018/0164746 A1 | 6/2018 | Nicolas et al. | |

* cited by examiner

*Primary Examiner* — Elias Desta
(74) *Attorney, Agent, or Firm* — Brooks, Cameron & Huebsch, PLLC (57) ABSTRACT

Methods, apparatuses, and non-transitory machine-readable media associated with relative humidity (RH) sensors are described. Examples can include receiving from an RH sensor RH information of an environment of a processing resource or a memory resource coupled to the processing resource, or both, determining that the RH information indicates an RH level above a particular threshold for the processing resource or the memory resource, or both, and disabling one or more aspects of the processing resource or the memory resource, or both, to mitigate damage to the processing resource or the memory resource, or both, responsive to determining that the RH is above the particular threshold.

20 Claims, 3 Drawing Sheets

424 —

```
┌─────────────────────────────────────────────────────────────┐
│ RECEIVING FROM A RELATIVE HUMIDITY (RH) SENSOR              │
│ RH INFORMATION OF AN ENVIRONMENT OF A PROCESSING RESOURCE OR│─426
│ A MEMORY RESOURCE COUPLED TO THE PROCESSING RESOURCE, OR BOTH│
└─────────────────────────────────────────────────────────────┘
                              │
┌─────────────────────────────────────────────────────────────┐
│ DETERMINING THAT THE RH INFORMATION INDICATES AN RH LEVEL ABOVE│
│   A PARTICULAR THRESHOLD FOR THE PROCESSING RESOURCE         │─428
│              OR THE MEMORY RESOURCE, OR BOTH                 │
└─────────────────────────────────────────────────────────────┘
                              │
┌─────────────────────────────────────────────────────────────┐
│  DISABLING ONE OR MORE ASPECTS OF THE PROCESSING RESOURCE    │
│    OR THE MEMORY RESOURCE, OR BOTH, TO MITIGATE DAMAGE TO    │
│ THE PROCESSING RESOURCE OR THE MEMORY RESOURCE, OR BOTH,     │─430
│        RESPONSIVE TO DETERMINING THAT THE RH IS ABOVE        │
│                  THE PARTICULAR THRESHOLD                    │
└─────────────────────────────────────────────────────────────┘
```

ID
RELATIVE HUMIDITY SENSOR

TECHNICAL FIELD

The present disclosure relates generally to apparatuses, non-transitory machine-readable media, and methods associated with a relative humidity sensor.

BACKGROUND

A computing device is a mechanical or electrical device that transmits or modifies energy to perform or assist in the performance of human tasks. Examples include thin clients, personal computers, printing devices, laptops, mobile devices (e.g., e-readers, tablets, smartphones, etc.), internet-of-things (IoT) enabled devices, and gaming consoles, among others. An IoT enabled device can refer to a device embedded with electronics, software, sensors, actuators, and/or network connectivity which enable such devices to connect to a network and/or exchange data. Examples of IoT enabled devices include mobile phones, smartphones, tablets, phablets, computing devices, implantable devices, vehicles, home appliances, smart home devices, monitoring devices, wearable devices, devices enabling intelligent shopping systems, among other cyber-physical systems.

An electrical (or electronic) component is a part of a system (e.g., computing device) used to affect the electrons or their associated fields in a manner consistent with the intended function of the system. Electrical components include capacitors, inductors, resistors, diodes, transistors, etc.

DETAILED DESCRIPTION

Apparatuses, machine-readable media, and methods related to a relative humidity sensor are described. As used herein, "relative humidity" refers to the amount of water moisture in air expressed as a percentage of the amount used for saturation at the same temperature. Devices are becoming computerized, automated, and increasingly intelligent. Sensitive electronical components are placed in various environments that may not be controlled, such as in a vehicle or in scientific instruments. These electrical components can be affected by humidity, condensation or corrosion that may be caused by the humidity, and other environmental factors. Electrical components can fail due to increased humidity levels, which may result in failure of an associated system, associated electrical components, or a combination thereof.

An electrical component, as used herein, can include a processing resource (e.g., a processor), a memory resource coupled to the processing resource, or both. "Electrical component" may be used interchangeably herein with "a processing resource or a memory resource coupled to the processing resource, or both", "processing resource", "a memory resource coupled to the processing resource", or a combination thereof. In examples of the present disclosure, "electrical component" may refer to only the processing resource or the memory resource coupled to the processing resource, or both, or may refer to more or all elements of an electrical component (e.g., including elements other than the processing resource and/or the memory resource).

Examples of the present disclosure can reduce damage to electrical components, associated other electrical components, and associated systems by using an RH sensor to determine a relative humidity of an environment in which the electrical component resides and mitigate effects of humidity when the RH level rises about a particular threshold. This can result in cost savings, as electrical components can be saved instead of thrown away, or preventative maintenance can be performed ahead of failure. In the case of electrical components in vehicles, mitigating damage to electrical components can increase safety by acting or alerting users to act before electrical components are damaged and/or the vehicle underperforms.

Examples of the present disclosure can include receiving from an RH sensor RH information of an environment of a processing resource or a memory resource coupled to the processing resource, or both, determining that the RH information indicates an RH level above a particular threshold for the processing resource or the memory resource, or both and disabling one or more aspects of the processing resource or the memory resource, or both, to mitigate damage to the processing resource or the memory resource, or both, responsive to determining that the RH is above the particular threshold.

Other examples of the present disclosure can include an apparatus including an RH sensor located within an environment of a processing resource or the memory resource, or both of an autonomous vehicle and a controller coupled to the processing resource or the memory resource, or both. The controller can be configured to receive from the RH sensor RH information of the environment, track the RH information of the environment, and in response to the tracking indicating an RH above a particular threshold, perform a humidity-reducing action in the environment.

Yet other examples of the present disclosure can include a non-transitory machine-readable medium comprising a first processing resource in communication with a first memory resource having instructions executable by the first processing resource to receive from an RH sensor located on a second processing resource or a second memory resource, or both, RH information of an environment of the second processing resource or a second memory resource, or both— near-continuously track the RH information, and perform a humidity-reducing action based on the tracked RH information.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, designators such as "N," etc., particularly with respect to reference numerals in the drawings, indicate that a number of the particular feature so designation can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures can be identified by the use of similar digits. For example, 102 can reference element "02" in FIG. 1, and a similar element can be referenced as 302 in FIG. 3. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

Some examples of the present disclosure include the use of an RH sensor on an electrical component or within an environment of the electrical component to act as a trigger to warn that the electronic component is experiencing an environment that may promote electrical component failure (e.g., humidity level above a particular threshold). The RH sensor, in some examples, can be a micro RH sensor, such that it is small enough to fit on small electrical components or circuit boards (e.g., printed circuit boards (PCBs)) associated with the electrical component. As used herein, the environment of the RH sensor includes surroundings or conditions in which the electrical component operates.

RH information can be tracked and communicated to a controller or other actor (e.g., logic of a PCB) to act directly with the electrical component by turning it off or triggering other humidity-reducing actions when an undesired RH level is met. For instance, the RH information can be tracked and monitored to trigger alarms and warnings when particular humidity levels are reached. Tracking the RH information associated with the electrical component can reduce the likelihood of humidity causing a glitch or system failure without recovery. For instance, tracking the RH information in accordance with examples of the present disclosure may reduce failure in systems such as autonomous vehicles, scientific equipment, or other computing devices.

Figure 1A:
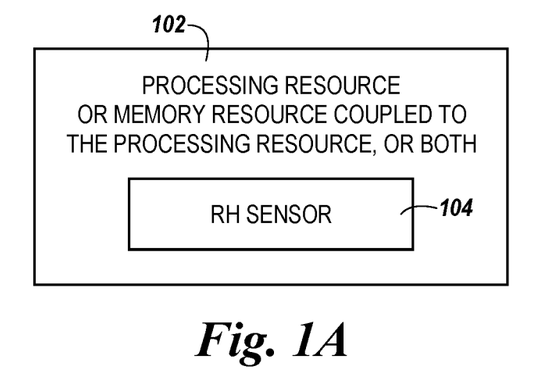
FIG. 1A is a diagram of an electrical component having a relative humidity (RH) sensor thereon in accordance with a number of embodiments of the present disclosure.
Figure 1B:
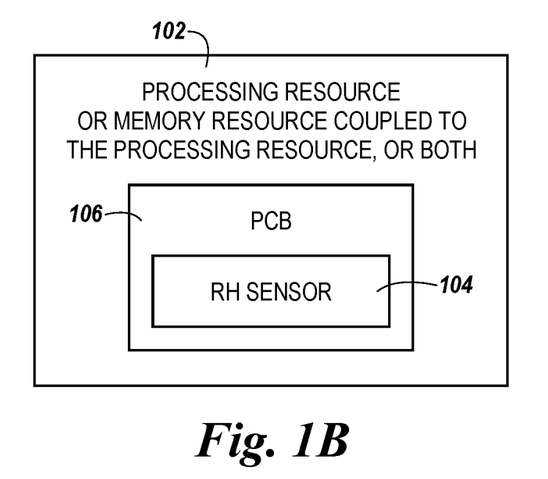
FIG. 1B is a diagram of an electrical component having a printed circuit board (PCB) with an RH sensor in accordance with a number of embodiments of the present disclosure.
Figure 1C:
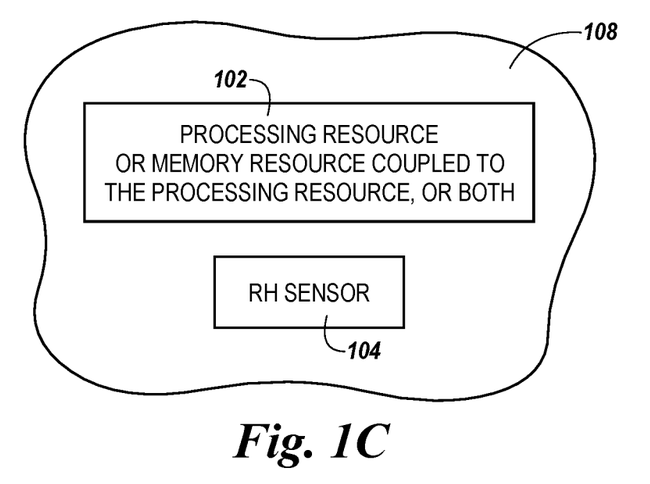
FIG. 1C is a diagram of an electrical component having an RH sensor associated therewith in accordance with a number of embodiments of the present disclosure.

FIGS. 1A-1C illustrate electrical components 102 that include a processing resource or a memory resource, or both, and RH sensors 104 associated therewith. FIG. 1A illustrate different arrangements of the electrical components 102 and associated RH sensors 104. While three arrangements are illustrated herein, more arrangements may be employed.

FIG. 1A is a diagram of an electrical component 102 having an RH sensor 104 thereon in accordance with a number of embodiments of the present disclosure. In some examples, the RH sensor 104 can be located on a same semiconductor die that comprises the processing resource or the memory resource, or both, and a controller can receive RH information associated with the electrical component 102 from the RH sensor 104. The RH sensor 104 can be powered (e.g., wired) separately from the electrical component 102 such that if the electrical component 102 shuts down (e.g., fails, turns off, etc.), the RH sensor 104 continues to operate. Similar, if the RH sensor 104 shuts down (e.g., fails, turns off, etc.), the electrical component 102 continues to operate.

FIG. 1B is a diagram of an electrical component 102 having a PCB 106 associated therewith and an RH sensor 104 in accordance with a number of embodiments of the present disclosure. In some examples, the RH sensor can be integrated into a circuit board (e.g., PCB 106) of the processing resource or the memory resource, or both to detect RH information associated with the electrical component 102. In such an example, the RH sensor 104 can include a micro RH probe sensor on the PCB 106. In some examples, the RH information can be tracked through an internal logic on the PCB 106 or tracked separately from the electrical component 102. Similar to FIG. 1A, the RH sensor 104 can be powered (e.g., wired) separately from the electrical component 102, the PCB 106, or both such that if the electrical component 102 shuts down (e.g., fails, turns off, etc.), the RH sensor 104 continues to operate. Similar, if the RH sensor 104 shuts down (e.g., fails, turns off, etc.), the electrical component 102 continues to operate.

FIG. 1C is a diagram of an electrical component 102 having an RH sensor 104 associated therewith in accordance with a number of embodiments of the present disclosure. In some examples, the RH sensor 104 can stand alone in an environment 108 of the electrical component 102. For instance, the RH sensor 104 can include a free-standing micro RH probe sensor within the environment 108 of the electrical component 102. In such an example, a controller communicatively coupled to the RH sensor 104 may receive RH information associated with the environment 108. "Communicatively coupled," as used herein, can include coupled via various wired and/or wireless connections between devices such that data can be transferred in various directions between the devices. The coupling may not be a direct connection, and in some examples can be an indirect connection.

This RH information may be applicable to the electrical component 102, as well as other electrical components within the environment 108. In such an example, when an RH level rises above a particular threshold, the controller can perform an action to mitigate damage to the electrical component 102 and/or other electrical components within the environment 108. For instance, a fan may be turned on to reduce humidity in the environment 108, which may mitigate damage to the electrical component 102, but also to other electrical components within the environment 108.

Figure 2:
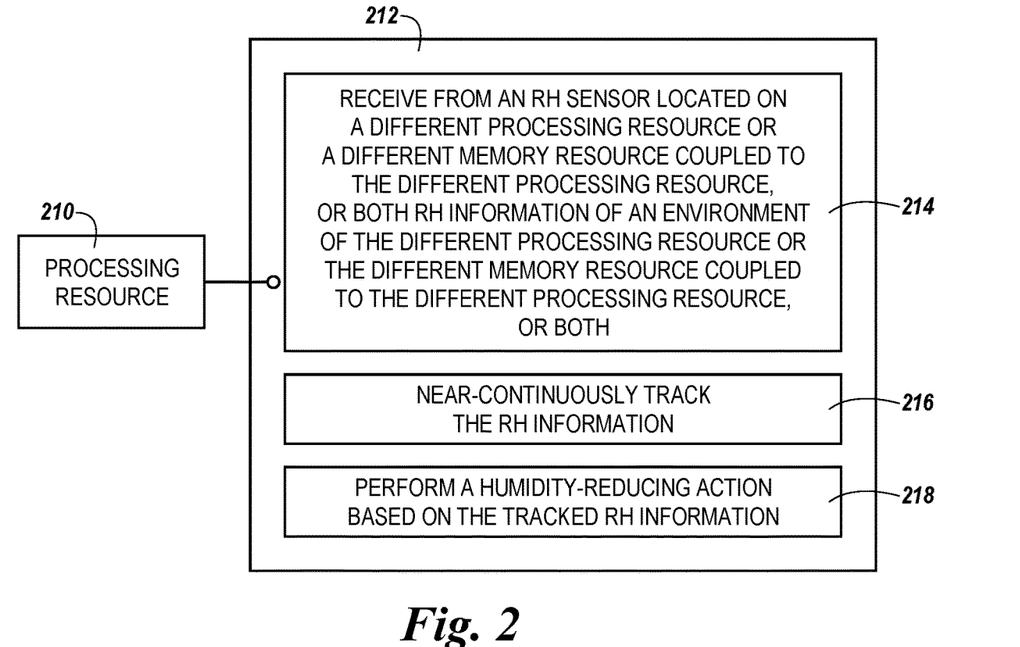
FIG. 2 is a functional diagram representing a processing resource in communication with a memory resource having instructions written thereon in accordance with a number of embodiments of the present disclosure.

FIG. 2 is a functional diagram representing a processing resource 210 in communication with a memory resource 212 having instructions 214, 216, and 218 written thereon in accordance with a number of embodiments of the present disclosure. The processing resource 210, in some examples, can be analogous to the controller 322 described with respect to FIG. 3. In the examples described with respect to FIG. 2, an electrical component is referred to as "a different processing resource or the different memory resource, or both". In some examples, the electrical component may comprise a same processing resource 210 and/or memory resource 212 as illustrated in FIG. 2.

The system illustrated in FIG. 2 can be a server or a computing device (among others) and can include the processing resource 210. The system can further include the memory resource 212 (e.g., a non-transitory MRM), on which may be stored instructions, such as instructions 214, 216, and 218. Although the following descriptions refer to a processing resource and a memory resource, the descriptions may also apply to a system with multiple processing resources and multiple memory resources. In such examples, the instructions may be distributed (e.g., stored) across multiple memory resources and the instructions may be distributed (e.g., executed by) across multiple processing resources.

The memory resource 212 may be electronic, magnetic, optical, or other physical storage device that stores executable instructions. Thus, the memory resource 212 may be, for example, non-volatile or volatile memory. For example, non-volatile memory can provide persistent data by retaining written data when not powered, and non-volatile memory types can include NAND flash memory, NOR flash memory, read only memory (ROM), Electrically Erasable Programmable ROM (EEPROM), Erasable Programmable ROM (EPROM), and Storage Class Memory (SCM) that can include resistance variable memory, such as phase change random access memory (PCRAM), three-dimensional cross-point memory (e.g., 3D XPoint™), resistive random access memory (RRAM), ferroelectric random access memory (FeRAM), magnetoresistive random access memory (MRAM), and programmable conductive memory, among other types of memory. Volatile memory can require power to maintain its data and can include random-access memory (RAM), dynamic random-access memory (DRAM), and static random-access memory (SRAM), among others.

In some examples, the memory resource 212 is a non-transitory MRM comprising Random Access Memory (RAM), an Electrically-Erasable Programmable ROM (EEPROM), a storage drive, an optical disc, and the like. The memory resource 212 may be disposed within a controller and/or computing device. In this example, the executable instructions 214, 216, and 218 can be "installed" on the device. Additionally and/or alternatively, the memory resource 212 can be a portable, external or remote storage medium, for example, that allows the system to download the instructions 214, 216, and 218 from the portable/external/remote storage medium. In this situation, the executable instructions may be part of an "installation package". As described herein, the memory resource 212 can be encoded with executable instructions for performing a humidity-reducing action in an environment of a different processing resource or a different memory resource, or both.

The instructions 214, when executed by a processing resource such as the processing resource 210, can include instructions to receive from an RH sensor located on a different processing resource or a different memory resource, or both, RH information of an environment of the different processing resource or a different memory resource, or both. The RH sensor may be located physically on the different processing resource or the different memory resource, or both, or integrated into a circuit board coupled with the different processing resource or the different memory resource, or both. The RH information can include, for instance, a humidity level, a change in humidity level, a temperature, or a temperature change in the environment associated with the different processing resource or the different memory resource, or both, or a combination thereof.

The instructions 216, when executed by a processing resource such as the processing resource 210, can include instructions to near-continuously track the RH information. As used herein, "near-continuously" includes determining (e.g., tracking measuring, capturing, etc.) without meaningful breaks. Near-continuously tracking the RH information can include tracking and logging humidity levels of the environment and making determinations about when a humidity level rises above a particular threshold. For instance, the particular threshold may be a level at which damage to the different processing resource or the different memory resource, or both may occur. For instance, if the humidity is above the particular threshold level, undesired effects may occur to the different processing resource or the different memory resource, or both, but if the humidity is below the particular threshold level, the different processing resource or the different memory resource, or both may be considered safe. The tracking can be near-continuous such that action can be taken when it is determined that the humidity level is above the particular threshold, to reduce the amount of time the different processing resource or the different memory resource, or both is exposed to the undesired humidity level. In some examples, the tracking is not near continuous, but may be scheduled (e.g., receive and/or track RH information every 5 seconds, every 5 minutes, every 5 hours, etc.).

The RH information can be tracked through internal login on a circuit board (e.g., a PCB) coupled with the different processing resource or the different memory resource, or both or separate from the device, for instance using a controller communicatively coupled to the different processing resource or the different memory resource, or both. In some examples, the controller is a computing device that may contain a processing resource and a memory resource to execute instructions. The controller may be included in a system (e.g., computing device) housing the different processing resource or the different memory resource, or both or in a separate device that may be located external to the different processing resource or the different memory resource, or both and associated system. The controller may track and analyze RH information received from the RH sensor and execute instructions based on that information. For instance, the controller may trigger humidity-reducing actions, as described further herein.

Tracking the RH information can also include determining how different processing resource or the different memory resource, or both react to particular humidity levels. Performance of the different processing resource or the different memory resource, or both at different RH levels can be tracked using the tracked RH information. For instance, using artificial intelligence (AI), particular humidities and associated different processing resource or the different memory resource, or both reactions can be tracked. AI, as used herein, includes a controller, computing device, or other system to perform a task that normally requires human intelligence. This reaction information can be logged and compared with similar or the same components to determine preventive maintenance schedules (e.g., via the IoT and IoT devices). For instance, if a particular different processing resource or the different memory resource, or both tends to wear out at a particular humidity level after 12 months, even with humidity-reducing efforts, replacement may be scheduled at 11 months. The tracked information may also be used to customize systems with humidity-reducing components, particularly when they are associated with different processing resource or the different memory resource, or both determined to be sensitive to particular humidity levels.

In some examples, tracking the RH information can include determining a moisture content of an environment of the different processing resource or the different memory resource, or both. As used herein, the term "moisture content" refers to the quantity of water in the environment of the different processing resource or the different memory resource, or both. Moisture content of the environment of the different processing resource or the different memory resource, or both can be based on the received RH information and an amount of time the different processing resource or the different memory resource, or both has been in the environment. For instance, the moisture content of the environment of the different processing resource or the different memory resource, or both can increase as the length of time the electrical component is in the humid environment increases.

The instructions 218, when executed by a processing resource such as the processing resource 210, can include instructions to perform a humidity-reducing action based on the tracked RH information. For instance, the humidity-reducing action can be initiated responsive to the tracking indicating an RH level above a particular threshold, the humidity-reducing action can be ceased responsive to the tracking indicating the RH level below the particular threshold, or both. A humidity-reducing action can include an action taken to mitigate damage to the different processing resource or the different memory resource, or both or system (e.g., computing device) of which it is a part.

Example humidity-reducing actions can include triggering a fan in the environment of the different processing resource or the different memory resource, or both, shutting down the different processing resource or the different memory resource, or both, shutting down the associated system, sending an alert that a particular RH level (e.g., a threshold level) has been reached or is approaching, sending an alert regarding preventative maintenance (e.g., "schedule maintenance soon"), suggesting an action for a user to take (e.g., "shut down computer", "run outside fan", etc.), or a combination thereof, among others. In some instances, sending an alert can include delivering data associated with an effect of the particular RH level on different processing resource or the different memory resource, or both t. For instance, data associated with different processing resource or the different memory resource, or both, such as how the different processing resource or the different memory resource, or both is affected by a particular RH level or different RH levels, can be stored (e.g., in the memory resource 212). This data can be delivered or stored for analysis.

In some examples, initiation and ceasing of the humidity-reducing action can be done dynamically using AI. As used herein, dynamically can include variable and/or constantly changing in response to a particular influence. For instance, when RH information is received that an RH of an environment associated with a particular different processing resource or the different memory resource, or both is X percent, a controller or logic in a PCB may determine that the particular different processing resource or the different memory resource, or both and/or other similar different processing resources or different memory resources, or both have failed when the RH has reached X percent. As a result, a humidity-reducing action can be performed when the RH reached X percent. Similar, when the RH drops below X percent, the humidity-reduction action can be ceased. Particular changes in humidity may also trigger a humidity-reducing action. For instance, if the RH rises a threshold percentage in a particular period of time, even if it stays below the overall top threshold, the different processing resource or the different memory resource, or both may be shut down. Similar, if the RH drops a threshold percentage in a particular period of time, even if it stays above the overall bottom threshold, different processing resource or the different memory resource, or both may be shut down, in some examples.

Figure 3:
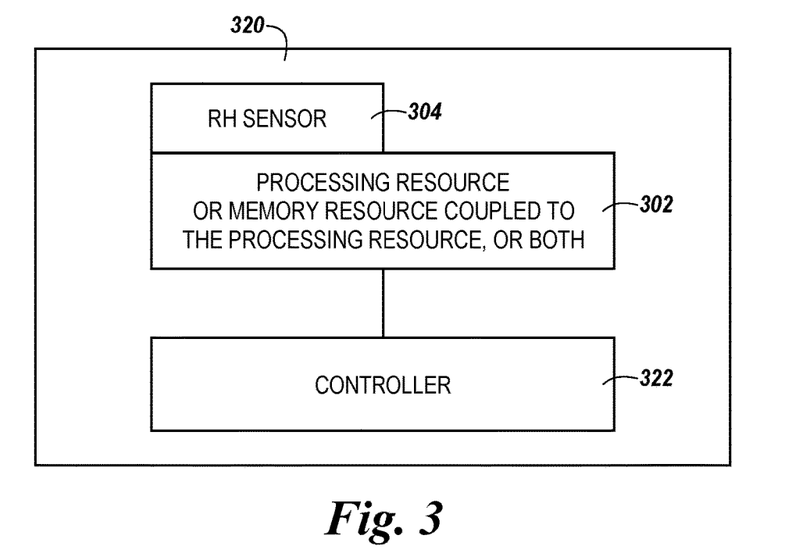
FIG. 3 is a functional block diagram in the form of a system including an apparatus having an electrical component, an RH sensor, and a controller in accordance with a number of embodiments of the present disclosure.

FIG. 3 is a functional block diagram in the form of a system including an apparatus 320 having an electrical component 302 (e.g., a processing resource or a memory resource, or both), an RH sensor 304, and a controller 322 (e.g., a processing resource (e.g., a processor), control circuitry, hardware, firmware, and/or software) in accordance with a number of embodiments of the present disclosure. The electrical component 302 can include and/or can be a memory device, in some embodiments, and can include a non-transitory MRM, and/or can be analogous to the memory resource 212 described with respect to FIG. 2.

In some examples, the apparatus 320 can be a vehicle or a portion of a vehicle; for instance, the electrical component (e.g., the memory device coupled to the processing resource) can be a memory device such as a dynamic random-access memory (DRAM) device used in the vehicle. A vehicle may include a car (e.g., sedan, van, truck, etc.), a connected vehicle (e.g., a vehicle that has a computing capability to communicate with an external server), an autonomous vehicle (e.g., a vehicle with self-automation capabilities such as self-driving), a semi-autonomous vehicle, a drone, a plane, and/or anything used for transporting people and/or goods.

The controller 322 can be communicatively coupled to the electrical component 302, the RH sensor, or a combination thereof. In some examples, the controller 322 can be a controller designed to assist in automation endeavors of a vehicle. For example, the controller 322 can be an advanced driver assistance system controller (ADAS). An ADAS can monitor data to prevent accidents and provide warning of potentially unsafe situations. For example, the ADAS may monitor sensors in a vehicle and take control of the vehicle operations to avoid accident or injury (e.g., to avoid accidents in the case of an incapacitated user of a vehicle). A controller 322 such as an ADAS may need to act and make decisions quickly to avoid accidents. A memory system (not illustrated here) communicatively coupled to the electrical component 302 can store reference data in memory media such that new data received from RH sensor 304 can be compared to the reference data such that quick decisions can be made by the controller 322 and/or logic of a PCB. In some examples, the controller 322 is not an ADAS, but is a computing device that may contain a processing resource and a memory resource to execute instructions to mitigate damage to an electrical component responsive to changes in RH levels of an environment in which the electrical component resides.

For example, in a context of semi- or fully autonomous vehicles, decisions related to data received from sensors may need to be made quickly, and latency in retrieval can be undesirable. In such examples, data requiring quick decisions may be written to a memory media including quick retrieval features such as DRAM. However, a vehicle environment in which DRAM resides may be harsh with changing humidity conditions. If the DRAM (e.g., electrical component 302) is exposed to high humidity levels, it may underperform or fail, which may result in failure of other components of the vehicle or the entire vehicle.

To address this potential failure, the RH sensor 304 can be located within an environment of the DRAM (e.g., electrical component 302) of the vehicle. The controller 322 can receive from the RH sensor 304 RH information of the environment and track the received RH information. The RH sensor can be located on a PCB associated with the DRAM and integrated into the logic of the PCB or it can be located in the environment of the DRAM. RH information (e.g., received from the RH sensor) can be tracked (e.g. wired) separately from information associated with the DRAM. For instance, if the RH sensor fails, the DRAM does not fail as a result, and vice versa.

In response to the tracking indicating an RH above a particular threshold, a humidity-reducing action can be performed in the environment. For instance, a fan within the environment may be activated when the RH is above a particular threshold. In such an example, the fan may be turned off when the RH falls below the particular threshold. Other examples include a driver alert being triggered suggesting an action the user take (e.g., "pull over the vehicle", "maintenance required", "maintenance required soon") depending on the severity of the potential damage of the electrical component's exposure to the humidity. In some examples, the vehicle may shut down if the RH is above the particular threshold, and the driver may be forced to pull over to the side of the road. Such humidity-reducing actions can be determined using AI based on similar electronic components in similar situations reacting in particular ways to different RH levels.

Figure 4:
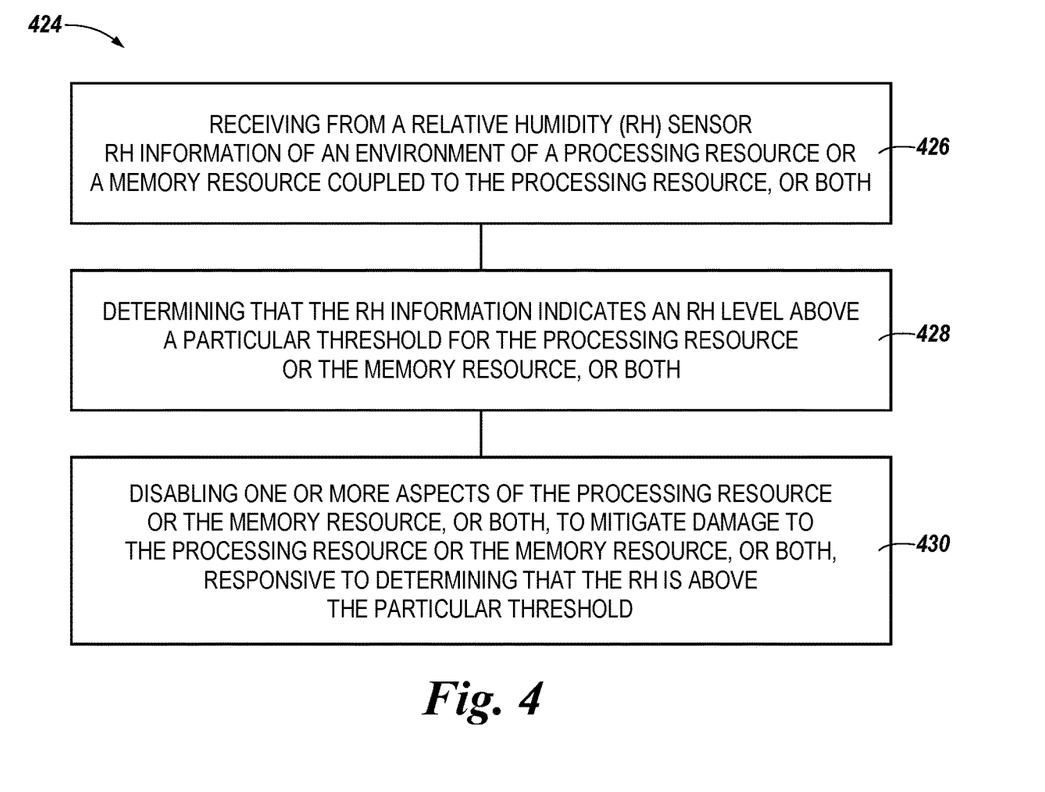
FIG. 4 is a flow diagram representing an example method associated with an RH sensor in accordance with a number of embodiments of the present disclosure.

FIG. 4 is a flow diagram representing an example method 424 associated with an RH sensor in accordance with a number of embodiments of the present disclosure. The method can be performed by a system or controller, such as the system described with respect to FIG. 2 or the controller 322 described with respect to FIG. 3.

At 426, the method 424 includes receiving from an RH sensor RH information of an environment of a processing resource or a memory resource, or both (e.g., an electrical component) of a computing device. The information can include humidity and temperature information, among other information. The RH sensor can be located on a same semiconductor die that comprises the processing resource or the memory resource, or both, on a PCB coupled with the processing resource or the memory resource, or both, or separate from the processing resource or the memory resource, or both and within an environment of the processing resource or the memory resource, or both. The RH sensor can be powered separately from the processing resource or the memory resource, or both or PCB such that failure of the RH sensor does not result in failure of the processing resource or the memory resource, or both or PCB (and vice versa).

At 428, the method 424 includes determining that the RH information indicates an RH level above a particular threshold for the processing resource or the memory resource, or both, and at 430, the method 424 includes disabling one or more aspects of the processing resource or the memory resource, or both to mitigate damage to the processing resource or the memory resource, or both responsive to determining that the RH level is above the particular threshold. In some examples, disabling one or more aspects of the processing resource or the memory resource, or both includes shutting down the processing resource or the memory resource, or both, or sending an alert to a user of a computing device housing the processing resource or the memory resource, or both. For example, sending an alert can include delivering data associated with an effect of the particular RH level on the processing resource or the memory resource, or both (e.g., "low tire pressure", "maintenance required", "pull over vehicle", etc.). In some examples, the method 424 can include storing data associated with an effect of the RH level on the processing resource or the memory resource, or both. For instance, data associated with the processing resource or the memory resource, or both, such as how the processing resource or the memory resource, or both is affected by a particular RH level or different RH levels, can be stored (e.g., in a memory resource). This data can be delivered to a user or stored for analysis.

In some instances, disabling one or more aspects of the processing resource or the memory resource, or both can include triggering a humidity control action associated with the processing resource or the memory resource, or both such as activating a fan or dehumidifier or triggering a preventative maintenance action, among others. Disabling one or more aspects of the processing resource or the memory resource, or both is not limited to the examples provided herein and can include a combination of actions in some examples.

In some examples, the method 424 can include determining a moisture content of the environment of the processing resource or the memory resource, or both and disabling one or more aspects of the processing resource or the memory resource, or both responsive to determining the RH level is above the particular threshold and the moisture content is above a different particular threshold. For instance, using the RH information and a period of time the processing resource or the memory resource, or both has been in the environment, a moisture content of the environment of the processing resource or the memory resource, or both can be determined. This determination can be used to decide if a humidity-reducing action is to be performed to reduce the moisture content of the environment of the processing resource or the memory resource, or both and mitigate damage. This determination can be made independently of the humidity rising above the particular threshold, or in conjunction with it. Using AI can aid in determining if the action should be taken; for instance, if a same or similar component has failed at a particular moisture content level, action can be taken to mitigate damage to the processing resource or the memory resource, or both before reaching that particular moisture content level.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    receiving, at a controller, from a relative humidity (RH) sensor RH information of an environment of a processing resource powered separately from the RH sensor or a memory resource powered separately from the RH sensor and coupled to the processing resource, or both;
    the controller executing instructions to track performances of the processing resource or the memory resource at different RH levels;
    the controller executing instructions to compare the tracked performances;
    determining, at the controller and based on the comparison, an RH level threshold for the memory resource, the processing resource, or both;
    determining, at the controller, that the RH information received indicates an RH level above the RH level threshold for the processing resource or the memory resource, or both; and
    the controller executing instructions to disable, one or more aspects of the processing resource or the memory resource, or both, to mitigate damage to the processing resource or the memory resource, or both, responsive to determining that the RH is above the RH level threshold.

2. The method of claim 1, further comprising receiving the RH information from the RH sensor, wherein the RH sensor is located on a same semiconductor die that comprises the processing resource or the memory resource, or both.

3. The method of claim 1, further comprising receiving the RH information from the RH sensor, wherein the RH sensor is located on a printed circuit board coupled with the processing resource or the memory resource, or both.

4. The method of claim 1, further comprising receiving the RH information from the RH sensor, wherein the RH sensor is located separate from the processing resource or the memory resource, or both and within an environment of the processing resource or the memory resource, or both.

5. The method of claim 1, further comprising:
    determining a moisture content of the environment of the processing resource or the memory resource, or both; and
    disabling one or more aspects of the processing resource or the memory resource, or both responsive to determining that the RH level is above the RH level threshold and the moisture content is above a moisture content threshold.

6. The method of claim 1, wherein disabling one or more aspects of the processing resource or the memory resource, or both comprises shutting down the processing resource or the memory resource, or both.

7. The method of claim 1, wherein disabling one or more aspects of the processing resource or the memory resource, or both comprises sending an alert to a user of a computing device housing the processing resource or the memory resource, or both.

8. The method of claim 1, further comprising storing data associated with an effect of the RH level on the processing resource or the memory resource, or both.

9. The method of claim 1, wherein disabling one or more aspects of the processing resource or the memory resource, or both comprises triggering a preventative maintenance action.

10. An apparatus, comprising:
    a relative humidity (RH) sensor located within an environment of a processing resource or the memory resource, or both of an autonomous vehicle,
        wherein the RH sensor is powered separately from the memory resource, the processing resource, or both; and
    a controller coupled to the processing resource or the memory resource, or both and configured to:
        receive from the RH sensor RH information of the environment;
        track the RH information of the environment wherein the tracking comprising:
            tracking performances of the processing resource or the memory resource at different RH levels;
            comparing the tracked performances; and
            determining, based on the comparison, an RH level threshold for the memory resource, the processing resource, or both; and
        in response to the tracking indicating an RH above the RH level threshold, perform a humidity-reducing action in the environment.

11. The apparatus of claim 10, wherein the memory resource is a dynamic random-access memory (DRAM) device.

12. The apparatus of claim 10, wherein:
    the RH sensor is located on and integrated into logic of the processing resource or the memory resource, or both.

13. The apparatus of claim 10, wherein the humidity-reducing action comprises activating a fan within the environment.

14. The apparatus of claim 10, wherein the humidity-reducing action comprises alerting a user of the autonomous vehicle and suggesting an action for the user to take.

15. The apparatus of claim 10, wherein:
    the RH sensor is located separate from the processing resource or the memory resource, or both.

16. The apparatus of claim 10, wherein the humidity-reducing action comprises shutting down the autonomous vehicle.

17. The apparatus of claim 10, further comprising the controller configured to cease the humidity-reducing action in response to the tracking indicating the RH has fallen below the RH level threshold.

18. A non-transitory machine-readable medium comprising a processing resource in communication with a memory resource having instructions executable to:
    receive from a relative humidity (RH) sensor located on a different processing resource or a different memory resource, or both, RH information of an environment of the different processing resource or the different memory resource, or both,
wherein the different processing resource, the different memory resource, or both, are powered separately from the RH sensor and wherein the tracking comprising:
near-continuously tracking performances of the different processing resource or the different memory resource at different RH levels;
comparing the tracked performances; and
determining, based on the comparison, an RH level threshold for the memory resource, the processing resource, or both; and
perform a humidity-reducing action based on the tracked RH information, wherein:
the humidity-reducing action is initiated responsive to the tracking indicating an RH level above the RH level threshold; and
the humidity-reducing action is ceased responsive to the tracking indicating the RH level below the RH level threshold.

19. The medium of claim 18, further comprising instructions executable to dynamically initiate and cease the humidity-reducing action using artificial intelligence (AI).

20. The medium of claim 18, further comprising instructions executable to track performance of the different processing resource or the different memory resource, or both at different RH levels using the tracked RH information.

* * * * *